(12) United States Patent
Ditizio (10) Patent No.: US 7,169,623 B2
(45) Date of Patent: Jan. 30, 2007

(54) SYSTEM AND METHOD FOR PROCESSING A WAFER INCLUDING STOP-ON-ALUMINUM PROCESSING

(75) Inventor: Robert Ditizio, Petaluma, CA (US)

(73) Assignee: Tegal Corporation, Petaluma, CA (US)

( * ) Notice: Subject to any disclaimer, the term of this patent is extended or adjusted under 35 U.S.C. 154(b) by 0 days.

(21) Appl. No.: 10/937,660

(22) Filed: Sep. 9, 2004

(65) Prior Publication Data

US 2006/0051881 A1 Mar. 9, 2006

(51) Int. Cl.
*H01L 21/00* (2006.01)
(52) U.S. Cl. .............................. 438/3; 438/48; 438/253
(58) Field of Classification Search .................. 438/3, 438/48, 59, 244, 250, 253, 396
See application file for complete search history.

(56) References Cited

U.S. PATENT DOCUMENTS 6,815,248 B2 * 11/2004 Leuschner et al. ............ 438/59
2002/0160541 A1 10/2002 Durcan et al.
2003/0199104 A1 10/2003 Leuschner et al.
2005/0051820 A1 * 3/2005 Stojakovic et al. ......... 257/295

* cited by examiner

*Primary Examiner*—Phuc T. Dang
(74) *Attorney, Agent, or Firm*—Fliesler Meyer LLP (57) ABSTRACT

Magnetic tunnel junction (MTJ) devices can be fabricated by a stop-on-alumina process whereby the tunnel junction layer serves as the stop layer during plasma overetching of the upper magnetic layer. The resulting side walls of the MTJ device are non-vertical in the vicinity of the tunnel junction layer which serves to electrically isolate the upper magnetic layer from the lower magnetic layer. The gas employed during plasma overetching excludes halogen containing species which results in highly selective etching of the magnetic layer vis-à-vis the alumina tunnel barrier layer. The introduction of oxygen in the gas may enhance the reproducibility of the overetch process. Finally, plasma treatment with He and $H_2$ followed by rinsing and baking subsequent to removal of the photoresist mask during the fabrication process enhances yield.

85 Claims, 8 Drawing Sheets

SYSTEM AND METHOD FOR PROCESSING A WAFER INCLUDING STOP-ON-ALUMINUM PROCESSING

FIELD OF THE INVENTION

The present invention relates generally to semiconductor fabrication and particularly to fabricating magnetic tunnel junction devices.

BACKGROUND OF THE INVENTION

Magnetic multilayer films are employed as a storage element in memories, such as magnetic random access memories (MRAM) and the like. The memory element for the MRAM technology is a patterned structure (memory bit) of multilayer material. The magnetic multilayer material is usually composed of a stack of different materials, such as permalloy (NiFe), cobalt-iron, copper, tantalum, etc. and may include some insulator like materials, such as $Al_2O_3$. A typical stack may contain as many as ten different or more overlying layers of these materials. To fabricate a storage element, it is necessary to deposit the materials in overlying blanket films, layer by layer, to form a patterned layer of photoresist (resist), and to etch the films into appropriate structures.

Ion beam milling or ion beam etching processes have been employed to remove magnetoresistive materials. Ion beam milling is a physical milling process. Areas that are not protected by the mask are removed by bombardment with ions. The bombardment of ions sputters or peels away the unprotected material. Ion beam milling operates with relatively low selectivity, and the portions of the stack that are near to the edges of the mask or the boundaries of an MRAM cell body can be easily damaged.

Chemical etching techniques have also been employed to selectively remove portions of deposited sheets. Examples of chemical etching techniques include dry etching techniques and wet etching techniques. After completion of the reactive etch of the multilayer material, the remaining portions of the stack are typically exposed to a post-etch passivation plasma.

Figure 12:
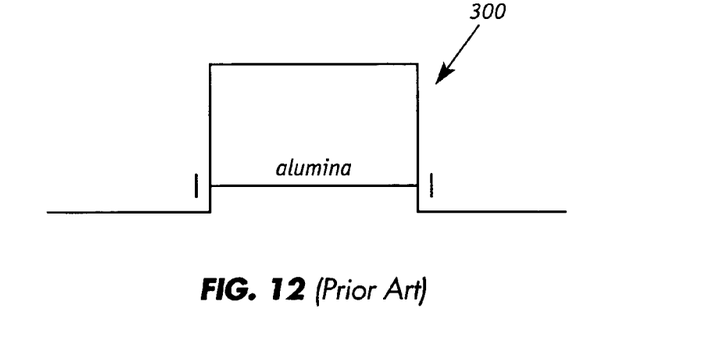
FIG. 12 illustrates a prior art MRAM structure with vertical profiles.

One of the drawbacks of current etching techniques is that the vertical profiles of MRAM structure are susceptible to electrical shorting across the thin tunnel junction. As illustrated in FIG. 12 the MRAM structure 300 has straight vertical walls (vertical relative to the plane of the surface being etched). The vertical walls adjacent the thin alumina insulator layer separating the upper magnet and the lower magnetic is inadequate to prevent electrical shorting.

SUMMARY OF THE INVENTION

Embodiments of the present invention are directed to, among other things, fabrication of magnetic tunnel junction (MTJ) devices whereby the alumina tunnel barrier layer serves as the stop layer during plasma overetching of the upper magnetic layer. The resulting MTJ devices, typically have non-vertical side walls, exhibit superior electrical isolation by the tunnel barrier layer of the upper and lower magnetic layers.

In another embodiment, the gases employed during plasma overetching preferably excludes halogen containing species which result in highly selective etching of the upper magnetic layer vis-à-vis the alumina tunnel barrier layer. The introduction of oxygen in the gas enhances the reproducibility of the process.

Finally, another embodiment is directed to corrosion plasma treatment with He and $H_2$ gas prior to or during the stripping of the photoresist mask. Optionally, rinsing with water and He and $H_2$ dehydration baking can be employed following the stripping step.

DESCRIPTION OF THE PREFERRED EMBODIMENTS

The present invention is based, in part, on the development of full stack, single mask and dual mask etching techniques for fabricating magnetic tunnel junction (MTJ) devices that are employed in magnetic random access memory (MRAM) devices. As further described herein, a critical aspect of the invention is that MTJ devices prepared by the inventive process afford superior electrical isolation of the top and bottom magnets as compared to prior MTJ devices.

An MTJ is comprised of multiple layers of ferromagnetic material separated by a thin insulating tunnel barrier layer, e.g., $Al_2O_3$. The insulating layer is sufficiently thin that quantum-mechanical tunneling of the charge carriers occurs between the ferromagnetic electrodes. The tunneling process is electron spin dependent, which means that the tunneling current across the junction depends on the spin-dependent electronic properties of the ferromagnetic materials and is a function of the relative orientation of the magnetic moments (magnetization directions) of the two ferromagnetic layers. The two ferromagnetic layers are designed to have different responses to magnetic fields so that the relative orientation of their moments can be varied with an external magnetic field. The MTJ is usable as a memory cell in a nonvolatile MRAM array.

Figure 2:
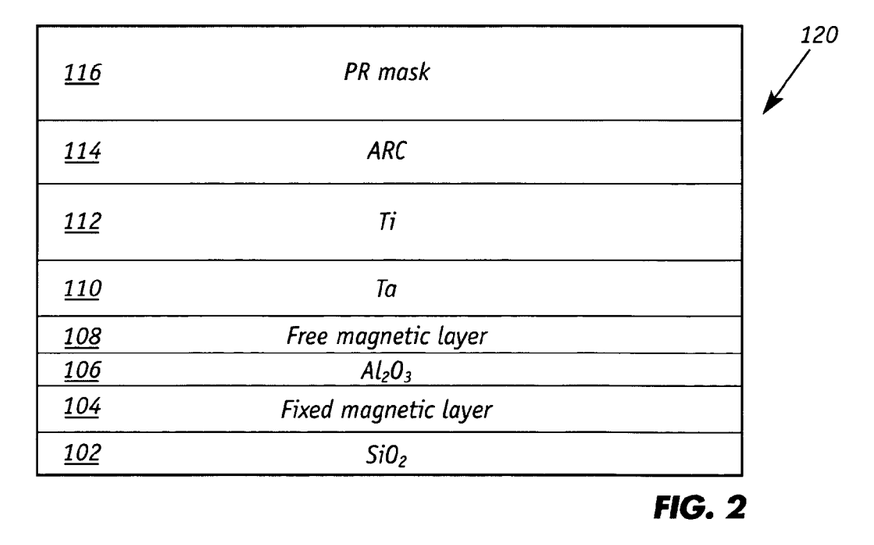
FIG. 2 illustrates an enlarged cross-sectional view of a free standing MRAM stack comprising multilayer films deposited on a supporting substrate prior to etching.

The embodiments of the invention will be illustrated by fabricating an MTJ device from the free standing multilayer MRAM structure or stack shown in FIG. 2, however, it is understood that the specific layers, e.g., materials and their arrangements, that form the multilayer structure can vary. MTJ and MRAM structures are known in the art and are described, for example, in U.S. Pat. No. 6,673,675 to Yates, et al., entitled "Methods of Fabricating an MRAM Device Using Chemical Mechanical Polishing," U.S. Pat. No. 6,677,165 to Lu, et al., entitled "Magnetoresistive Random Access Memory (MRAM) Cell Patterning," U.S. Pat. No. 6,653,704 to Gurney, et al., entitled "Magnetic Memory with Tunnel Junction Memory Cells and Phase Transition Material for Controlling Current to the Cells," U.S. Pat. No. 6,024,885 to Pendharkar, et al., entitled "Process for Patterning Magnetic Films," and U.S. Pat. No. 5,650,958 to Gallagher, et al., entitled "Magnetic Tunnel Junctions with Controlled Magnetic Response," and U.S. Patent Application Publication No. 2003/003757 to Nallan, et al, entitled "Method for Etching Tungsten or Tungsten Nitride in Semiconductor Structures," all of which are incorporated herein by reference.

Figure 1:
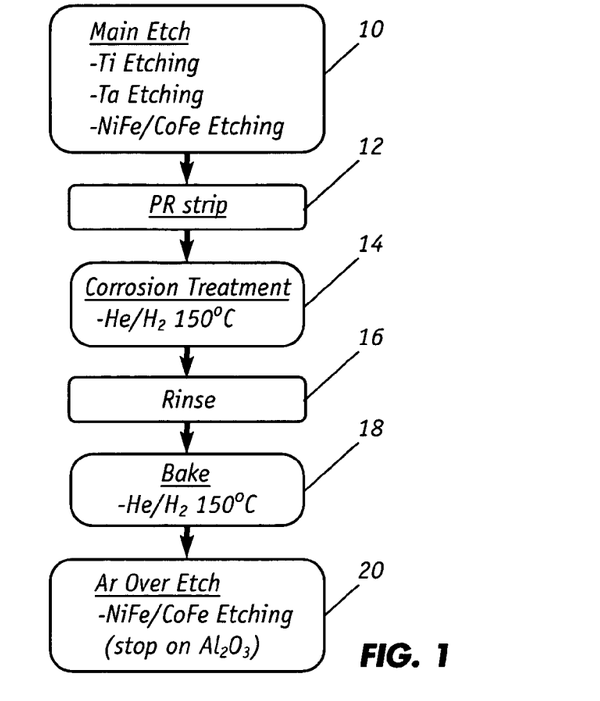
FIG. 1 illustrates the process sequence for fabricating a magnetic tunnel junction (MTJ) device for an MRAM.

FIG. 1 illustrates the main steps in the stop-on-alumina process for fabricating one or more MTJ devices from the multilayer MRAM structure 120 shown in FIG. 2. The individual layers of the multilayer MRAM structure 120 can be prepared by conventional techniques for fabricating integrated circuits and related electronics. Applicable processes for forming metallic layers include chemical vapor deposition (CVD) techniques, including low pressure chemical vapor deposition (LPCVD), and physical vapor deposition (PVD), such as sputtering. Sputtering and oxidation can be used to form alumina in the dielectric layer. Suitable techniques and devices are described, for example, in U.S. Pat. No. 5,672,239 to DeOrnellas entitled "Integrated Semiconductor Wafer Processing System," U.S. Pat. No. 4,464,223 to Gorin entitled "Plasma Reactor Apparatus and Method," U.S. Pat. No. 4,209,357 to Gorin et al. entitled "Plasma Reactor Apparatus" and U.S. Pat. No. 4,357,195 to Gorin entitled "Apparatus and Method of Controlling a Plasma Reaction," and U.S. Patent Application 2002/0139665 to DeOrnellas et al. entitled "Plasma Etch Reactor and Method," which are all incorporated by reference.

As shown in FIG. 2, the multilayer MRAM structure 120 includes a substrate 102 onto which are deposited a number of layers of different materials. As is apparent, the relative thickness of the layers in FIG. 2 have been exaggerated for illustrative purposes. The term "substrate" may include any semiconductor-based structure that has an exposed semiconductor surface. Structures include, for example, silicon, silicon-on insulator (SOI), silicon-on sapphire (SOS), aluminum titanium carbide (AlTiC) doped and undoped semiconductors, epitaxial layers of silicon supported by a base semiconductor foundation, and other semiconductor structures. The semiconductor need not be silicon-based. The semiconductor could be silicon-germanium, germanium, or gallium arsenide.

Layer 104 comprises the bottom or fixed ferromagnetic (or magnetic) layer that is fabricated from suitable ferromagnetic materials such as, for example, CoFe, NiFe, CoFeB, NiFeCr, CoNiFe, and mixtures thereof. The bottom ferromagnetic layer is "fixed" in that its magnetization orientation is in the plane of the layer but is fixed so as to not be able to rotate in the presence of an applied magnetic field in the desired range of interest for the MTJ device. The fixed ferromagnetic layer is typically 25 Å to 100 Å thick. The ferromagnetic layer is fixed by interfacial exchange coupling with an underlying antiferromagnetic layer. Suitable antiferromagnetic materials include, for example, MnFe, NiMn, PtMn, IrMn, and mixtures thereof. The underlying antiferromagnetic layer is typically 25 Å to 100 Å thick. Though not shown in FIG. 2, the multilayer MRAM structure will typically include a bottom contact layer that is situated between the substrate 100 and bottom magnetic layer 104. Suitable bottom contact layer materials include, for example, Ta, Ti, and mixtures thereof. Finally, a thin adhesion promotion layer such as a TiN layer that is between 25 Å to 100 Å thick is preferably employed between the substrate and the contact layer.

The tunnel barrier layer 106 comprises alumina and can be formed by reactive sputtering. The alumina layer is typically 5 Å to 20 Å thick.

The "free" ferromagnetic (or magnetic) layer 108 comprises material whose magnetization is able to be rotated in the plane of the layer relative to the fixed magnetization of the fixed ferromagnetic layer 104. Suitable ferromagnetic materials such as, for example, CoFe, NiFe, CoFeB, NiFeCr, CoNiFe and mixtures thereof can be employed. The free ferromagnetic layer is typically 20 Å to 50 Å thick. In a preferred embodiment, layer 108 comprises a NiFe (permalloy) and CoFe bilayer, with the CoFe being deposited directly on the alumina. In the case of a NiFe/CoFe bilayer, the NiFe typically ranges from 15 Å to 50 Å in thickness and the CoFe typically ranges from 10 Å to 40 Å in thickness.

The multilayer MRAM structure 120 typically includes a capping or top contact layer over the free ferromagnetic layer 108. The top contact layer is typically 200 Å to 2000 Å thick. Although only a single layer of material can be employed, in a preferred embodiment, the top contact layer comprises a Ta/Ti bilayer 110, 112. The Ta layer 110 typically ranges from 50 Å to 100 Å in thickness and the Ti layer 112 typically ranges from 300 Å to 1500 Å in thickness. As further described herein, in this preferred embodiment, the Ti layer will also serve as a hard mask in an overetch step.

The anti-reflection coating (ARC) 114 is commonly deposited in semiconductor fabrication prior to the deposition of the photoresist (PR) mask 116. The ARC layer is typically 300 Å to 800 Å thick. ARC coatings absorb radiation to form an optically opaque film to enhance the contrast of the imaging resist. ARC coatings effectively reduce reflection of the incident radiation back into the overlying PR mask layer 116. This prevents overexposure of the photoresist material.

Anti-reflection coatings are classified largely into two groups by their working principles. One group uses as an anti-reflective film, a so-called photoabsorptive film, with a strong capability to absorb exposure light, and the second group uses light interference to prevent reflection. Photoabsorptive organic films absorb light before being reflected by the substrate surface, so that the light reflected from the substrate (or underlying material) and returned to the resist is mitigated.

Examples of anti-reflective films of the second group include Si and TiN. The anti-reflective film is typically deposited over a metal to such a thickness that the reflected light from the resist/anti-reflective film interface and the reflected light from the anti-reflective film/substrate interface are in opposite phase with each other in order to reduce the reflection.

Although either positive or negative photoresist can be employed to fabricate the PR mask layer 116, positive photoresist is preferred over negative photoresist because the former generally has better resolution capabilities and pattern transfer characteristics. In positive photoresist, the exposed portions are susceptible to removal by the developer while the unexposed portions are not. After the photoresist layer is applied, a mask having openings therein is then positioned over the photoresist layer and a light source is located over the mask so that light shines through the openings onto selected areas of the photoresist layer.

After selective exposure, the photoresist coated substrate is treated with a developer solution to dissolve and remove either the radiation-exposed or the unexposed areas of the photoresist (depending upon whether a positive or a negative photoresist is utilized) resulting in a patterned or developed photoresist, exposing the underlying layer Ti previously deposited. The patterned photoresist mask layer 116 is then used as a mask to etch layers below the photoresist layer so that portions of the underlying layer not protected by the hardened resist layer may now be etched away.

Embodiments of the stop-on-alumina process of the present invention as illustrated in the flow diagram of FIG. 1 include an initial main etch step 10 whereby Ti layer 112, Ta layer 110, and portions of the NiFe (permalloy) and CoFe bilayer, that comprise the free ferromagnetic layer 106, are successively removed in the MRAM structure 120 of FIG. 2. These layers are preferably removed by plasma reactive etching using a variety of etch chemistries. Generally, the chemistry includes two or more of the following species: halogen gases, halogen containing gases, noble gases, and diatomic gases; the last two gases serving as inert carrier gases. A critical feature of the process is stopping the main etch before reaching the CoFe/alumina interface. Preferably, when etching the upper free magnetic film consisting of the NiFe and CoFe bilayer, the chemistry employed comprises a mixture of from about 10% to 50% $Cl_2$ by volume and from about 10% to 30% $BCl_3$, with the reminder primarily being an inert carrier gas. (All percentages for gases are on a volumetric basis unless otherwise specified.) It has been demonstrated that this mixture provides a substantially residue-free etching of the magnetic films. Controlling the etch rate with minimal residue formation is critical for stopping close to CoFe/alumina interface.

It has also been demonstrated when plasma etching magnetic layers comprising transition metals such as NiFe with etchant gases containing $Cl_2$ and/or Ar that regulating the amount of oxygen in the plasma chamber can influence the etch selectivity with respect to the underlying alumina. That is, a higher NiFe/alumina selectivity can be achieved by controlling the flow of oxygen into the plasma chamber. One embodiment of the plasma overetch process entails reducing the background oxygen to levels that do not affect the etching process while concurrently re-introducing oxygen in a measurable and controllable manner into the plasma chamber. Sources of the background oxygen that may enter the plasma chamber include, for example: (1) atmospheric oxygen; (2) outgassing from materials in the chamber; (3) other processing modules in the process system; and (4) source window sputtering that occurs during plasma etching.

When "uncontrolled" background oxygen in the chamber is reduced, the selectivity between NiFe and alumina can be optimized by re-introducing a very small amount (e.g., ~0.08 sccm) of oxygen into the chamber. One technique to re-introduce the oxygen employs two separate carrier gas sources that are connected to the chamber. The first source supplies an $Ar/O_2$ gas mixture comprising 99.9% Ar and 0.1% $O_2$ to the plasma chamber while a second source supplies a gas containing 100% Ar in parallel to the chamber. When re-introducing oxygen into the plasma chamber, it is preferred that the base pressure of the chamber be reduced to ~0.001 mT. Additionally, the source power should be low (100–200 W) to minimize window sputtering.

Following the main etch step 10 as shown in FIG. 1, the patterned photoresist mask 116 is removed in step 12 by conventional means. It has been found that exposure of CoFe-containing stack structures to high temperature (>about 150–175° C.) after a halogen containing etch process results in gross residue formation. In addition, exposure of the MRAM structure 120 of FIG. 2 to a dry strip process has been found to result in what appears to be severe degradation of the pristine alumina surface particularly when oxygen is used. Similar results have been observed for nitrogen stripping. Therefore, is it preferred that wet photoresist stripping or $He/H_2$ be employed and that neither high temperature nor dry stripping with $O_2$ be employed in the MRAM stack stop-on-alumina processes of embodiments of the present invention.

Figure 3:
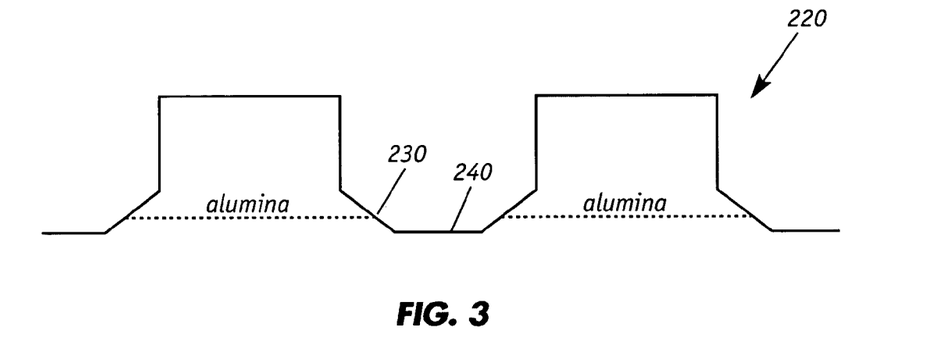
FIG. 3 illustrates the cross-section of an MRAM structure following the main etch step showing the non-vertical profile thereof.

FIG. 3 illustrates the etch profile of the MRAM structure that is expected following removal of the pattern photoresist mask 116. FIG. 3 only shows two cells 220, however, it is understood that the MRAM structure can comprise a plurality of cells that eventually form part of the MRAM device. The side wall of each cell is essentially vertical beginning from the top edge to the upper magnetic layer, e.g., NiFe layer, at which conjuncture the profile slants and defines a non-vertical sloped surface 230. In the case of a full stack etch, the surface 230 protrudes outwardly and terminates at the surface 240 which would typically correspond to the bottom contact layer.

Next, the MRAM structure 120 is preferably subjected to a corrosion treatment step 14 which is a passivation scheme to prevent corrosion of the structure 120 during subsequent processing. A preferred corrosion treatment comprises of plasma treatment in an environment containing a mixture of He and $H_2$. Preferably the mixture comprises at least 96% He and 4% or less of $H_2$ The process preferably occurs at an elevated temperature between 100° to 285° C. and preferably of about 150° C.

An optional water rinse step 16 whereby the device is rinsed with for preferably at least one to two minutes to remove contaminants follows. Preferably, de-ionized water at about room temperature (about 30° C.) is used.

After being rinsed, the device is baked in step 18 at an elevated temperature of between 100° to 285° C., and preferably at about 150° C., for between one to two minutes to remove excess moisture and He and $H_2$.

Figure 4:
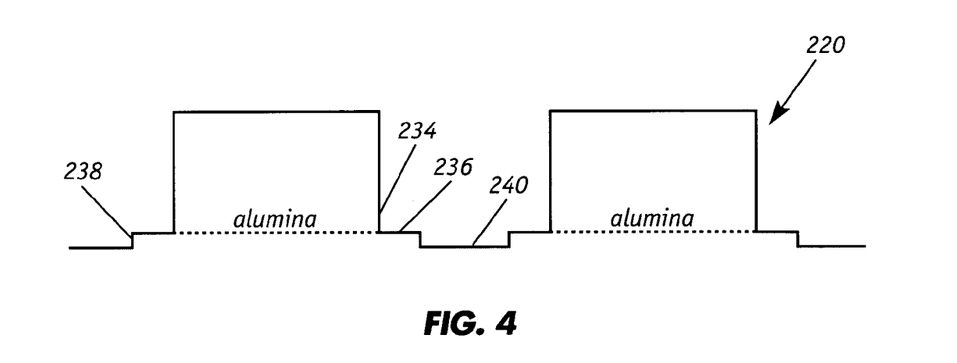
FIG. 4 illustrates the cross-section of an MRAM structure following the overetch step showing the non-vertical profile thereof.

Finally, the structure 120 undergoes an overetch etching step 20 whereby the remaining portions of the exposed free ferromagnetic layer 108, e.g., NiFe and CoFe bilayer, are removed whereby the alumina of the tunnel barrier layer 106 serves as the stop layer. FIG. 4 shows the etched profile of the MRAM structure 120 that is expected following the overetch step 20. With the selective removal of additional NiFe/CoFe, the stepwise profile defines an isolation region 236 which is the exposed horizontal surface of the alumina that separates the free ferromagnetic layer 234 and the lower fixed ferromagnetic layer 238. The profile remains essentially vertical until the isolation region 236. In this configuration of the MTJ device, the free ferromagnetic layer has a width $W_1$, which is about the same as that of the insulating tunnel barrier (alumina) layer. The fixed ferrogmagnetic layer has a width $W_2$, such that $W_2>W_1$. In addition, the width of the bottom magnetic layer (not shown) is longer than that of the tunnel barrier layer. In another embodiment of the MTJ device, the free ferromagnetic layer has a width $W_3$, the fixed ferromagnetic layer has a width $W_4$, and the insulating tunnel barrier (alumina) layer has a width $W_5$, such that $W_5 > W_4 \geqq W_3$ and preferably $W_4 > W_3$.

With the removal of the patterned photoresist mask 116, the Ti contact layer 114 serves as a hard mask for the overetch process which preferably comprises a plasma etch reaction in an atmosphere containing a small amount of oxygen as described above. In a preferred embodiment, a gas comprising a mixture of greater than about 99% argon and a small amount of oxygen is employed.

FIGS. 3 and 4 illustrate the single-mask, full stack stop-on-alumina process. In another embodiment of the invention, FIGS. 5A through 5G illustrate the sequence of steps of a two-mask, full stack stop-on-alumina process.

Figure 5A:
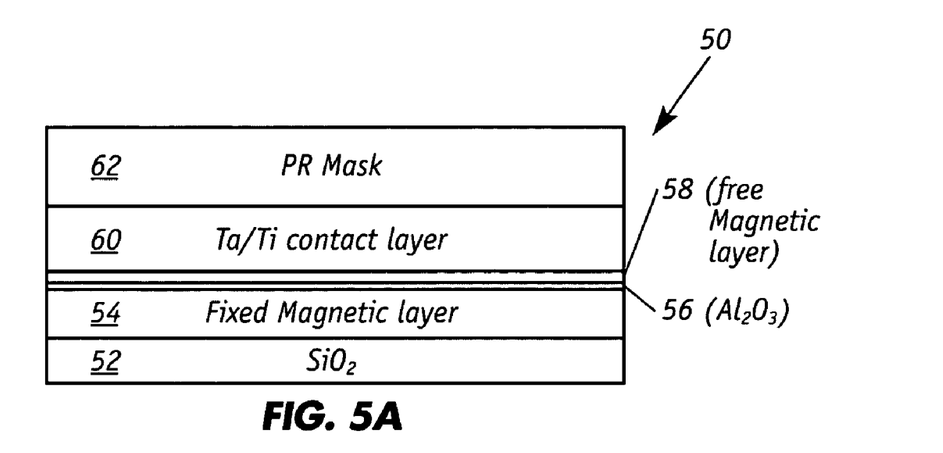
FIGS. 5A to 5G illustrate a two-mask stop-on-alumina process.

FIG. 5A shows the multi-layer MRAM structure 50 which includes a substrate 52 onto which is deposited a number of layers of different materials: (1) bottom or fixed ferromagnetic layer 54, (2) tunnel barrier layer 56, (3) free ferromagnetic layer 58, (4) cap or contact layer 60 and (5) photoresist layer 62. A patterned photoresist (PR) mask 68 is formed by selective exposure to radiation and then treated with a developer solution. The MRAM structure 50 may include an ARC; for illustrative purposes the ARC is considered part of the top contact layer 60 rather than a separate layer. Layers 54, 56, and 58 are said to comprise the "full stack" of the structure although additional layers, such as layer 60, can be included depending on the process design flow of a particular device.

Figure 5B:
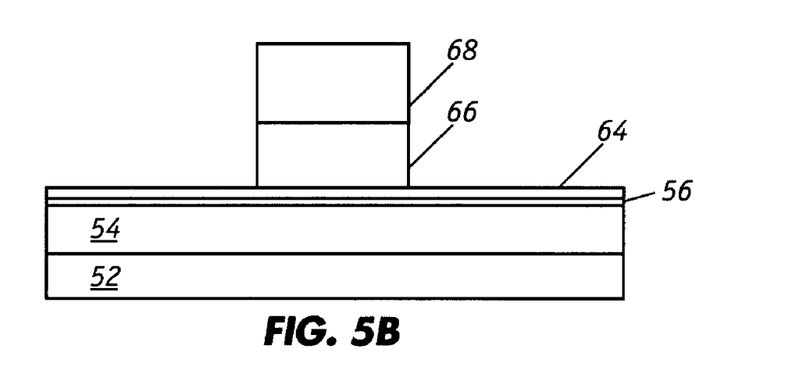

FIG. 5B shows the structure after the top contact layer 60 of FIG. 5a has been partially removed using the PR mask 68 thereby forming contact layer 66. Part of free ferromagnetic layer 64 is exposed.

Figure 5C:
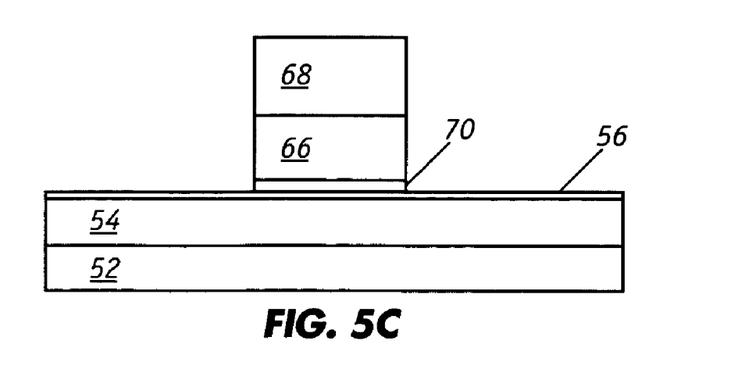
Figure 5D:
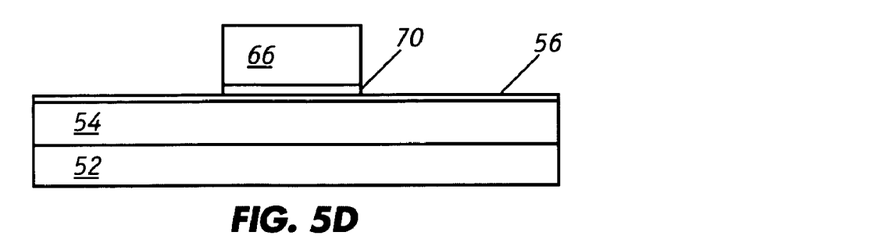

FIG. 5C shows the structure after the main etch of the stop-on-alumina process whereby exposed portions of free ferromagnetic layer 64 have been removed to form free ferromagnetic layer 70. Portions of tunnel barrier layer 56 are exposed. Thereafter, the PR mask 68 is removed as shown in FIG. 5D.

Figure 5E:
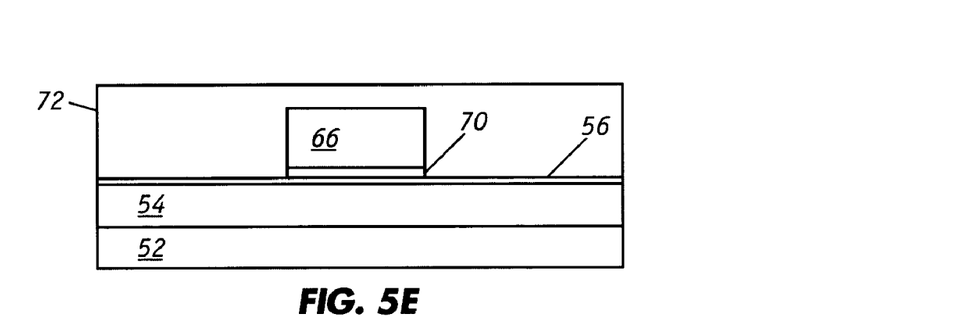

Subsequently, a layer of hard mask is deposited over the structure as shown in FIG. 5E. This hard mask preferably comprises materials such as, for example, Ta, Ti, TiN, TiAlN, and $SiO_2$. A patterned photoresist layer (not shown) is then formed over hard mask 72.

Figure 5F:
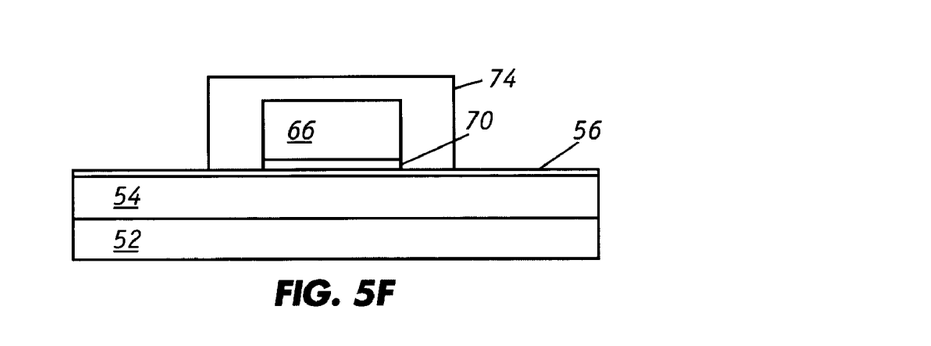
Figure 5G:
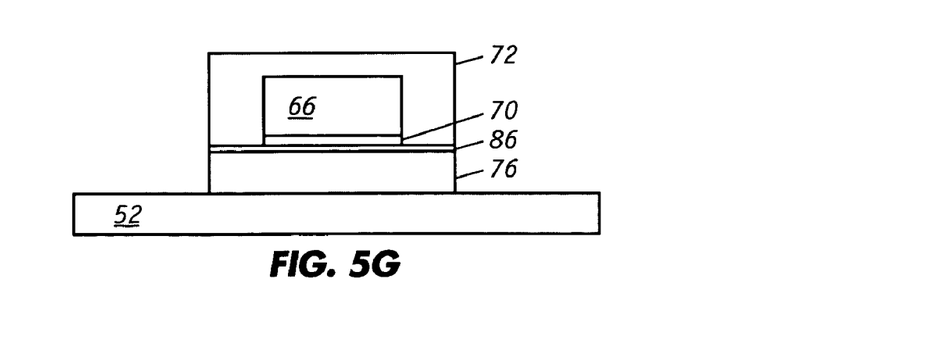

FIG. 5F shows the structure after portions of the hard mask has been etched and the patterned PR mask has been removed. It is apparent that the remaining hard mask 74 covers the top contact layer 66 and upper magnetic layer 70. The hard mask 74 is then used to etch the exposed tunnel barrier layer 56 and the lower ferromagnetic layer 54 to leave the structure as shown in FIG. 5G in which the outer perimeters of the tunnel barrier layer 86 and that of the lower ferromagnetic layer 76 are substantially flush with the outer perimeter of hard mask 72.

The overetching process exhibits high selectivity. It is expected that the free ferromagnetic layer will be etched at a rate of at least 7 faster than the rate at which the dielectric material, e.g., $Al_2O_3$, is etched.

As illustrated in FIGS. 3 and 4, the overetch step is used to achieve the electrical isolation between the top and bottom magnets 234, 238 in the MRAM device. This aspect is accomplished by selectively etching the NiFe/CoFe bilayer of the free ferromagnetic layer 108 using the alumina as the stop layer. Precise control of the NiFe/CoFe etch rate is possible because there are significant differences in sputter thresholds between the NiFe and CoFe and that of alumina. Experiments that confirmed these phenomena were conducted using a 6550 Spectra® etch reactor from Tegal Corp. (Petaluma, Calif.).

Specifically, NiFe and CoFe sputter rates were measured with monolayer test wafers and alumina etch rates were measured with alumina/NiFe test structures. The test structure consisted of a substrate that had a NiFe layer deposited thereon and a very thin layer of alumina (~15 Å) over the NiFe. The measured alumina etch rates were representative of the thin film properties that would be found in a tunnel-type magnetoresistive (TMR) stack.

Figure 6:
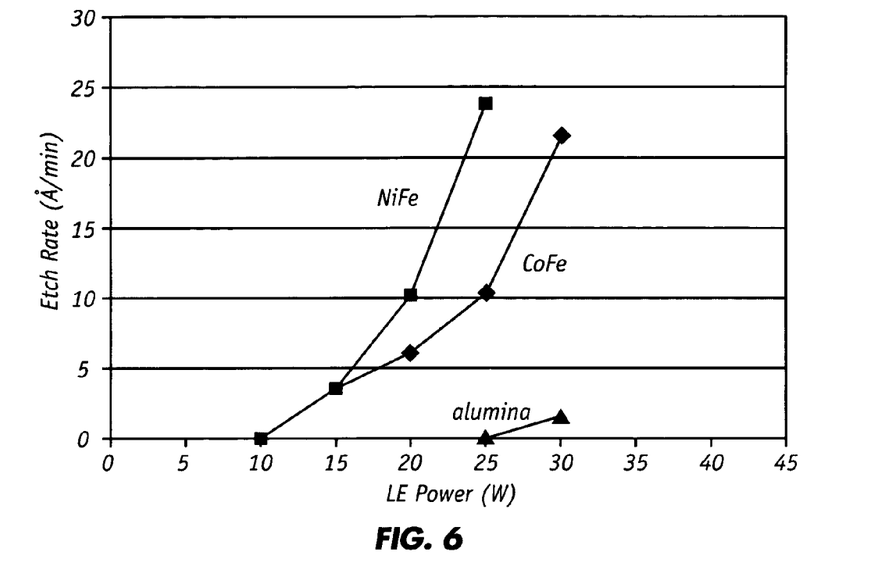
FIG. 6 is a graph comparing NiFe, CoFe, and alumina etch rates vs. the power level on a lower electrode power during plasma etching in an overetch process in argon gas.

As is apparent from the graph in FIG. 6, a significant difference was observed between the onset of sputtering for the alloys in comparison to that of the alumina. It was further observed in etch rate tests, which were performed on alumina/NiFe test structures at bias power levels greater than 10 W and less than 25 W, that the alumina did not etch. These observations indicate that under specific etch conditions, significant amounts of NiFe and CoFe can be etched from a TMR stack while only a small amount of alumina is etched at the same time.

Figure 7:
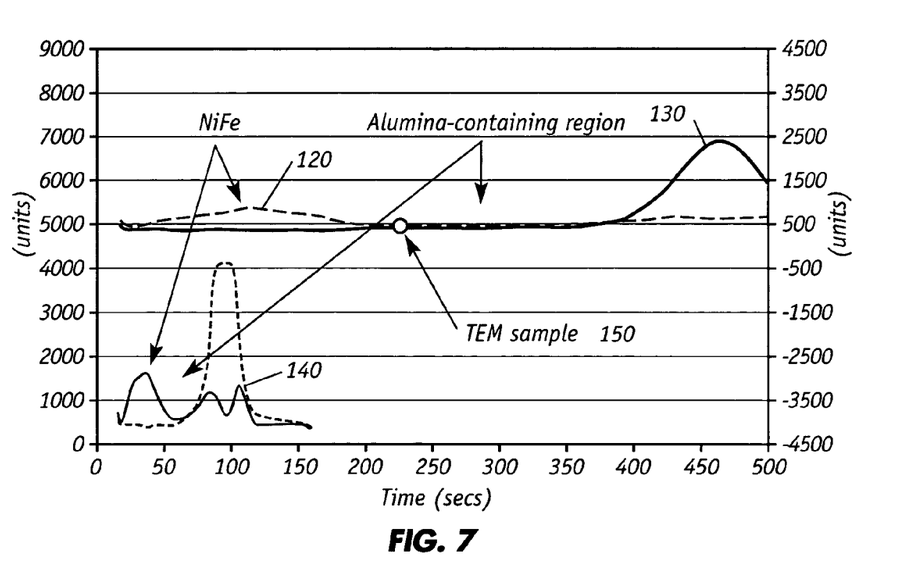
FIG. 7 is a graph of optical emission etch pitch density traces vs. time from an NiFe overetch process using two different power levels on patterned MRAM structures.

A method for detecting the endpoint of NiFe/CoFe etching was also developed for monitoring the etching process of a TMR stack. Stack wafers comprising NiFe and CoFe layered formed on an underlying layer of alumina were prepared. After the layers above the NiFe had been removed with a reactive chemistry, the stack wafers were subject to overetch using an Ar-only chemistry at two different power levels. Optical emission endpoint detection (EPD) traces from two typical stack wafers are shown in FIG. 7. As is apparent, the elemental constituents of NiFe and CoFe are fairly good emitters in an argon plasma.

The EPD traces indicate that some structure is visible from the individual layers in the stack over the duration of the argon etch process. The first peak 120 in the endpoint trace of FIG. 7 shows the clearing of the magnetic layer above the alumina. The long flat region in the top graph corresponds to the slow removal of the alumina. This region is considerably shorter in the higher power trace shown at the bottom of FIG. 7. The second set of peaks 130 after the long flat region at the top of FIG. 7 corresponds to the etching removal of the magnetic layers below the alumina. This second set of peaks 140 is also observed in the higher power case at the bottom of FIG. 7.

In practice, the progress of the etching reaction can be monitored by an optical detector such as a fairly broadband photocell detector or photomultiplier tube with an optical filter. The detector could also be a mass spectrometer or the like. The photocell, when coupled with an amplifier, provides a voltage output which is proportional to the intensity of the optical emission of the plasma. Detectors are described, for example, in U.S. Pat. No. 4,357,195 to Gorin which is incorporated herein by reference.

Figure 8A:
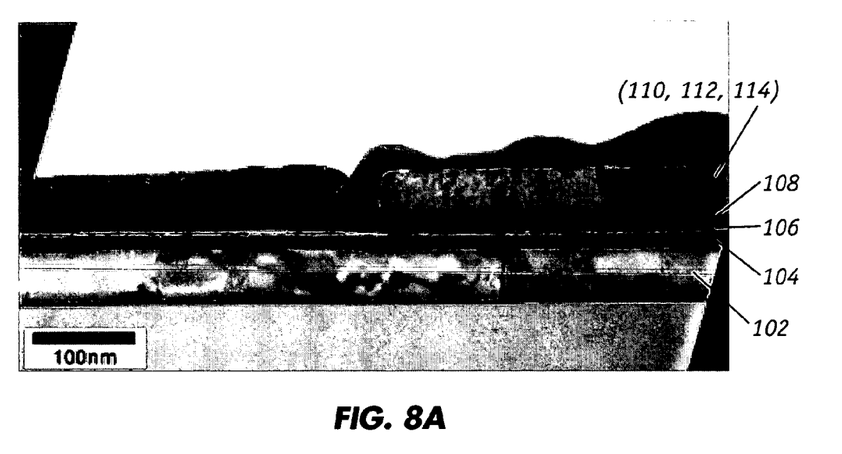
FIGS. 8A and 8B are TEM photographs of a MTJ device taken following the stop-on-alumina etching process.
Figure 8B:
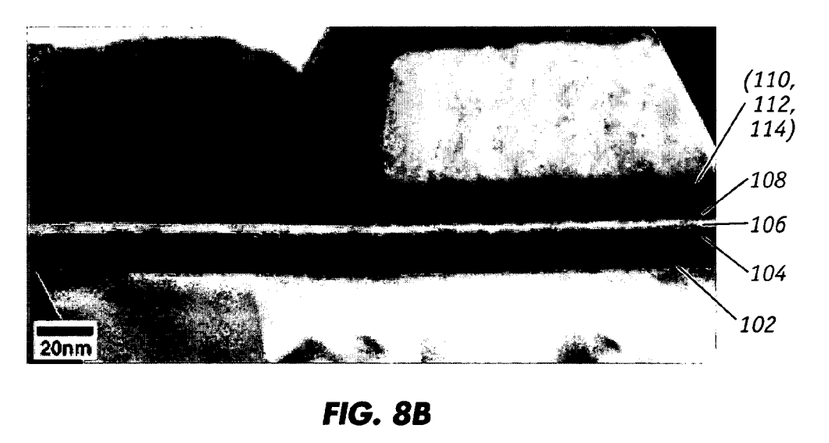

FIGS. 8A and 8B are two transmission electron microscopy (TEM) photographs that were taken from a MRAM stack wafer that was etched to the point indicated by the dot 150 in the endpoint trace, i.e., flat area between the two peaks 120, 130, shown at the top of FIG. 7. The fixed ferromagnetic layer 104, alumina layer 106, free ferromagnetic layer 108, Ta layer 110, Ti layer 112, and ARC layer 114 that are deposited on $SiO_2$ substrate 102 are evident in each TEM. FIG. 8A shows an open area between arrays and FIG. 8B shows a dense area between features.

Figure 9:
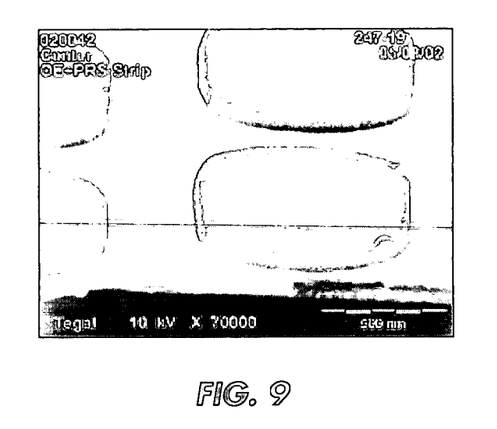
FIG. 9 is a SEM photograph of an MRAM stack wafer after a reactive plasma main etching step, overetch, and photoresist strip.

FIG. 9 is a scanning electron microscope (SEM) photograph obtained from an MRAM wafer, which had both NiFe and CoFe deposited above the alumina, that was exposed to the combined main etch and overetch. This image shows that the complete top electrode etch to be relatively veil-free. Veils are residues that form on the walls of features during processing and can consist of organic or inorganic components. The process is effective across an entire 6 inch wafer and shows no signs of alumina punch-through anywhere on the wafer.

Figure 10A:
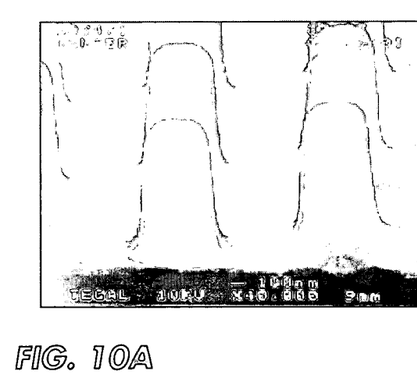
FIGS. 10A and 10B are SEM photographs for two wafers that were etched under identical conditions except the wafer of FIG. 9A was exposed to a wet rinse after etching.
Figure 10B:
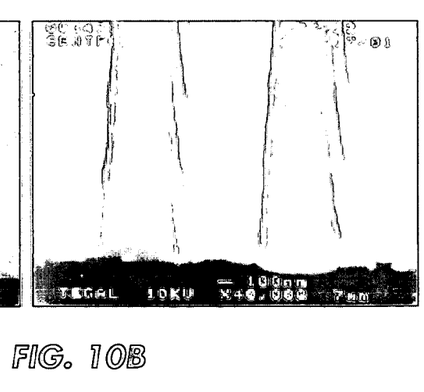

FIGS. 10A and 10B are SEMs photographs of two MRAM wafers both of which were etched under identical conditions with halogen based chemistry except that the wafer of FIG. 10B was exposed to a water rinse after etching. As is apparent from FIG. 10A, the exposed magnetic material in the field area for the wafer became severely corroded as a result of air exposure for several hours whereas the rinsed wafer of FIG. 10B did not corrode noticeably. The rinse was effective in eliminating the halogens and passivating the surface.

Figure 11:
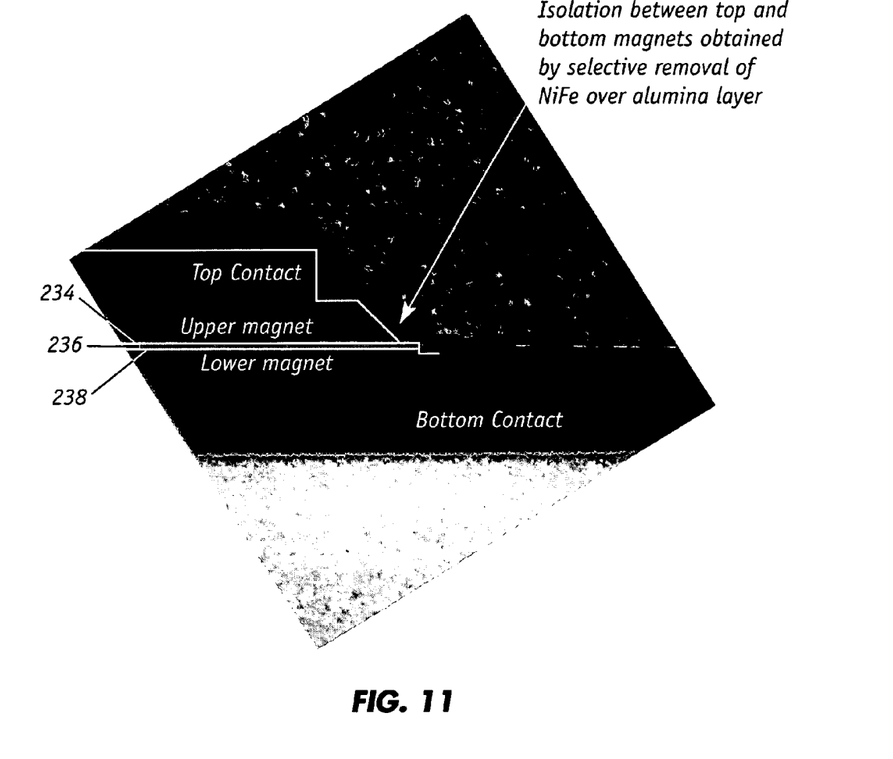
FIG. 11 is a TEM photograph of an MTJ device.

FIG. 11 is a TEM of a MTJ device that was fabricated with the inventive technique. As is apparent, the alumina layer provides excellent electrical isolation of the top and bottom magnets.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A process of fabricating a magnetic tunnel junction device that comprises the steps of:
   (a) forming a first magnetic member;
   (b) forming a second magnetic member;
   (c) forming an insulating tunnel barrier layer that comprises a dielectric material located between the first magnetic member and the second magnetic member;
   (d) forming a contact layer on an upper surface of the second magnetic member;
   (e) forming a patterned mask over the contact layer;
   (f) selectively removing portions of the contact layer;
   (g) removing the patterned mask; and
   (h) selectively removing portions of the second magnetic member and the insulating tunnel barrier layer such that at least one side portion of the second magnetic member and of the insulating tunnel barrier layer define a non-vertical profile which protrudes outwardly from the at least one side portion.

2. A process of fabricating a magnetic tunnel junction device that comprises the steps of:
   (a) forming a first magnetic member;
   (b) forming a second magnetic member;
   (c) forming an insulating tunnel barrier layer that comprises a dielectric material located between the first magnetic member and the second magnetic member; and
   (d) selectively removing portions of the second magnetic member and the insulating tunnel barrier layer such that at least one side portion of the second magnetic member and of the insulating tunnel barrier layer define a non-vertical profile which protrudes outwardly from the at least one side portion.

3. A process of fabricating a magnetic tunnel junction device that comprises the steps of:
   (a) forming a lower (or first) magnetic member;
   (b) forming an upper (or second) magnetic member;
   (c) forming an insulating tunnel baffler layer that comprises a dielectric material located between the lower magnetic member and the upper magnetic member;
   (d) forming a contact layer on an upper surface of the upper magnetic member;
   (e) forming a patterned mask over the contact layer to create a multilayer structure;
   (f) selectively removing portions of the contact layer that are exposed by the patterned mask;
   (g) removing the patterned mask subsequent to step (f) to yield a multilayer device wherein the contact layer has a substantially vertical side profile and the contact layer partially covers the upper magnetic member and wherein the upper magnetic member covers the insulating tunnel baffler layer; and
   (h) selectively removing side portions of the upper magnetic member that are distal from the multilayer device thereby causing an outer perimeter of the upper magnetic member to recede toward the multilayer device and thereby exposing an upper layer of the insulating tunnel barrier layer so that said exposed upper layer electrically separates the upper magnetic member that has the outer perimeter on an upper surface of the insulating tunnel barrier layer from the lower magnetic member that is underneath the insulating tunnel barrier layer.

4. A process of fabricating a magnetic tunnel junction device that comprises the steps of:
   (a) forming a lower (or first) magnetic member;
   (b) forming an upper (or second) magnetic member;
   (c) forming an insulating tunnel barrier layer that comprises a dielectric material located between the lower magnetic member and the upper magnetic member; and
   (d) selectively removing side portions of the upper magnetic member that are distal from the multilayer device thereby causing an outer perimeter of the upper magnetic member to recede toward the multilayer device and thereby exposing an upper layer of the insulating tunnel barrier layer so that said exposed upper layer electrically separates the upper magnetic member that has the outer perimeter on an upper surface of the insulating tunnel barrier layer from the lower magnetic member that is underneath the insulating tunnel barrier layer.

5. The process of any of claims 1 to 4 wherein the second magnetic member has a width that is less than that of the insulating tunnel barrier layer.

6. The process of claim 5 wherein the first magnetic member has a width that is equal to or greater than that of the insulation tunnel barrier layer.

7. The process of claim 1 or 3 wherein step (h) comprises the steps of:
   (i) selectively etching a majority of the second magnetic member under first etching conditions; and thereafter
   (ii) selectively etching a remaining portion of the second magnetic member under second etching conditions such that the insulating tunnel barrier layer serves as a stop layer.

8. The process of claim 7 wherein step (h) comprises using the contact layer as a hard mask over the second magnetic member.

9. The process of claim 7 wherein in step (ii) the second magnetic member is etched at a rate that is at least 7 times faster than the rate at which the dielectric material is etched.

10. The process of claim 7 wherein the dielectric material is $Al_2O_3$ and wherein in step (ii) the second magnetic member is etched at a rate that is at least 7 times faster than the rate at which $Al_2O_3$ is etched.

11. The process of claim 7 wherein step (i) comprises plasma etching using a first plasma source gas comprising a first halogen-based chemically functional etchant species;

and step (ii) comprises of plasma etching using a second plasma source gas comprising argon and oxygen.

12. The process of claim 7 further comprising the steps of monitoring the etching in step (i) and terminating the etching in step (i) when an endpoint has been reached when the majority of the second magnetic member has been removed.

13. The process of claim 12 wherein the endpoint is reached when the monitoring detects etching of the insulating tunnel barrier layer.

14. The process of claim 11 wherein step (i) comprises reactive plasma etching using etchant species comprising a mixture of $Cl_2$ and $BCl_3$.

15. The process of claim 14 wherein step (i) comprises adding oxygen gas to the etchant species.

16. The process of claim 14 wherein the mixture of step (i) comprises from about 10% to 50% $Cl_2$ by volume and from about 10% to 30% $BCl_3$ by volume.

17. The process of claim 14 wherein the mixture of step (i) consists essentially of from about 10% to 50% $Cl_2$ by volume and from about 10% to 30% $BCl_3$ by volume.

18. The process of claim 1 or 3 wherein following step (g) and before step (h), the process further comprises the steps of:
    (1) plasma treating the device in an environment containing He and $H_2$ to remove corrosive materials;
    (2) optionally, rinsing the treated device; and
    (3) baking the device to remove the He and $H_2$.

19. The process of claim 18 wherein step (h) comprises the steps of:
    (i) selectively etching a majority of the second magnetic member under first etching conditions; and thereafter
    (ii) selectively etching a remaining portion of the second magnetic member under second etching conditions such that the insulating tunnel barrier layer serves as a stop layer.

20. The process of claim 18 wherein step (1) comprises plasma treatment at a temperature of 100° C. to 285° C. and the environment contains at least 96% He by volume and 4% or less of $H_2$ by volume and step (3) comprises heating the device at a temperature between 100° C. to 285° C.

21. The process of claim 18 wherein step (i) comprises reactive plasma etching using etchant species comprising a mixture of $Cl_2$ and $BCl_3$.

22. The process of claim 21 wherein the mixture comprises from about 10% to 50% $Cl_2$ by volume and from about 10% to 30% $BCl_3$ by volume.

23. The process of claim 21 wherein the mixture consists essentially of from about 10% to 50% $Cl_2$ by volume and from about 10% to 30% $BCl_3$ by volume.

24. The process of claim 19 further comprising the steps of monitoring the etching in step (i) and terminating the etching in step (i) when an endpoint has been reached when the majority of the second magnetic member has been removed.

25. The process of claim 24 wherein the endpoint is reached when the monitoring detects etching of the insulating tunnel barrier layer.

26. The process of claim 1 or 3 wherein only a single patterned mask is employed.

27. The process of claim 26 wherein the patterned mask comprises a hard mask.

28. The process of claim 26 wherein the patterned mask comprises photoresist.

29. The process of claim 1 or 3 further comprising the step of providing a support substrate onto which a second contact layer is formed.

30. The process of claim 29 wherein the contact layer is a conductive non-magnetic layer that formed from material that is selected from the group consisting of Ta, Ti and mixtures thereof and the second contact layer is a layer that is formed from material that is selected from the group consisting of Ta, Ti and mixtures thereof.

31. The process of any of claims 1 to 4 wherein the magnetic tunnel junction device is employed in a magnetic random access memory device.

32. The process of claim 31 wherein an outer perimeter of the magnetic tunnel junction device that includes at least part of the (i) second magnetic member and of the (ii) insulating tunnel barrier layer defines a non-vertical profile and the second magnetic member has a width that is less than that of the tunnel barrier layer.

33. The process of claim 32 wherein the first magnetic member has a width that is equal to or greater than that of the tunnel barrier layer.

34. The process of claim 1 or 3 wherein step (f) comprises plasma etching portions of the contact layer.

35. The process of claim 2 or 4 wherein step (d) comprises the steps of:
    (i) selectively etching a majority of the second magnetic member under first etching conditions; and thereafter
    (ii) selectively etching a remaining portion of the second magnetic member under second etching conditions such that the insulating tunnel barrier layer serves as a stop layer.

36. The process of claim 35 wherein in step (ii) the second magnetic member is etched at a rate that is at least 7 times faster than the rate at which the dielectric material is etched.

37. The process of claim 35 wherein the dielectric material is $Al_2O_3$ and wherein in step (ii) the second magnetic member is etched at a rate that is at least 7 times faster than the rate at which $Al_2O_3$ is etched.

38. The process of claim 35 wherein step (i) comprises plasma etching using a first plasma source gas comprising a first halogen-based chemically functional etchant species; and step (ii) comprises of plasma etching using a second plasma source gas comprising a second halogen-based chemically functional etchant species.

39. The process of claim 35 further comprising the steps of monitoring the etching in step (i) and terminating the etching in step (i) when an endpoint has been reached when the majority of the second magnetic member has been removed.

40. The process of claim 39 wherein the endpoint is reached when the monitoring detects etching of the insulating tunnel barrier layer.

41. The process of claim 38 wherein step (i) comprises reactive plasma etching using etchant species comprising a mixture of $Cl_2$ and $BCl_3$.

42. The process of claim 41 wherein step (i) comprises adding oxygen gas to the etchant species.

43. The process of claim 41 wherein the mixture of step (i) comprises from about 10% to 50% $Cl_2$ by volume and from about 10% to 30% $BCl_3$ by volume.

44. The process of claim 41 wherein the mixture of step (i) consists essentially of from about 10% to 50% $Cl_2$ by volume and from about 10% to 30% $BCl_3$ by volume.

45. A process of fabricating a magnetic tunnel junction device that comprises the steps of:
    (a) forming a first magnetic member;
    (b) forming a second magnetic member;
    (c) forming an insulating tunnel barrier layer that comprises a dielectric material located between the first magnetic member and the second magnetic member;

(d) forming a contact layer on an upper surface of the second magnetic member;
(e) forming a patterned mask over the contact layer;
(f) selectively removing portions of the contact layer;
(g) removing the patterned mask; and
(h) selectively etching portions of the second magnetic member and the insulating tunnel barrier layer such that the second magnetic member is electrically isolated from the first magnetic member wherein the amount of insulating tunnel barrier layer that is removed is controlled by detecting the etching of the insulating tunnel barrier layer after the second magnetic member is etched to expose the insulating tunnel barrier layer.

46. A process of fabricating a magnetic tunnel junction device that comprises the steps of:
(a) forming a first magnetic member;
(b) forming a second magnetic member;
(c) forming an insulating tunnel baffler layer that comprises a dielectric material located between the first magnetic member and the second magnetic member;
(d) forming a contact layer on an upper surface of the second magnetic member;
(e) forming a patterned mask over the contact layer;
(f) selectively removing portions of the contact layer;
(g) removing the patterned mask; and
(h) selectively etching portions of the second magnetic member and the insulating tunnel barrier layer such that at least one side portion of the second magnetic member and of the insulating tunnel barrier layer define a non-vertical profile which protrudes outwardly from the at least one side portion wherein the amount of insulating tunnel barrier layer that is removed is controlled by detecting the etching of the insulating tunnel barrier layer after the second magnetic member is etched to expose the insulating tunnel barrier layer.

47. A process of fabricating a magnetic tunnel junction device that comprises the steps of:
(a) forming a lower (or first) magnetic member;
(b) forming an upper (or second) magnetic member;
(c) forming an insulating tunnel barrier layer that comprises a dielectric material located between the lower magnetic member and the upper magnetic member;
(d) forming a contact layer on an upper surface of the upper magnetic member;
(e) forming a patterned mask over the contact layer to create a multilayer structure;
(f) selectively removing portions of the contact layer that are exposed by the patterned mask;
(g) removing the patterned mask subsequent to step (f) to yield a multilayer device wherein the contact layer has a substantially vertical side profile and the contact layer partially covers the upper magnetic member and wherein the upper magnetic member covers the insulating tunnel baffler layer; and
(h) selectively etching side portions of the upper magnetic member that are distal from the multilayer device thereby causing an outer perimeter of the upper magnetic member to recede toward the multilayer device and thereby exposing an upper layer of the insulating tunnel baffler layer so that said exposed upper layer electrically separates the upper magnetic member that has the outer perimeter on an upper surface of the insulating tunnel barrier layer from the lower magnetic member that is underneath the insulating tunnel barrier layer wherein the amount of the insulating tunnel barrier layer that is removed is controlled by detecting the etching of the insulating tunnel barrier layer after the second magnetic member is etched to expose the insulating tunnel barrier layer.

48. A process of fabricating a magnetic tunnel junction device that comprises the steps of:
(a) forming a first magnetic member;
(b) forming a second magnetic member;
(c) forming an insulating tunnel barrier layer that comprises a dielectric material located between the first magnetic member and the second magnetic member;
(d) forming a contact layer on an upper surface of the second magnetic member;
(e) forming a patterned mask over the contact layer;
(f) selectively removing portions of the contact layer;
(g) removing the patterned mask; and
(h) plasma etching select portions of the second magnetic member and the insulating tunnel baffler layer whereby the insulating tunnel barrier layer is a stop layer and such that the second magnetic member is electrically isolated from the first magnetic member.

49. A process of fabricating a magnetic tunnel junction device that comprises the steps of:
(a) forming a first magnetic member;
(b) forming a second magnetic member;
(c) forming an insulating tunnel barrier layer that comprises a dielectric material located between the first magnetic member and the second magnetic member; and
(d) plasma etching select portions of the second magnetic member and the insulating tunnel barrier layer whereby to insulating tunnel barrier layer is a stop layer and such that the second magnetic member is electrically isolated from the first magnetic member.

50. A process of fabricating a magnetic tunnel junction device that comprises the steps of:
(a) forming a first magnetic member,
(b) forming a second magnetic member;
(c) forming an insulating tunnel barrier layer tat comprises a dielectric material located between the first magnetic member and the second magnetic member,
(d) forming a contact layer on an upper surface of the second magnetic member;
(e) forming a patterned mask over the contact layer;
(f) selectively removing portions of the contact layer;
(g) removing the patterned mask; and
(h) plasma etching select portions of the second magnetic member and the insulating tunnel baffler layer whereby to insulating tunnel barrier layer is a stop layer such that at least one side portion of the second magnetic member and of the insulating tunnel barrier layer define a non-vertical profile which protrudes outwardly from the at least one side portion.

51. A process of fabricating a magnetic tunnel junction device that comprises the steps of:
(a) forming a lower (or first) magnetic member;
(b) forming an upper (or second) magnetic member;
(c) forming an insulating tunnel baffler layer that comprises a dielectric material located between the lower magnetic member and the upper magnetic member;
(d) forming a contact layer on an upper surface of the upper magnetic member;
(e) forming a patterned mask over the contact layer to create a multilayer structure;
(f) selectively removing portions of the contact layer that are exposed by the patterned mask;
(g) removing the patterned mask subsequent to step (f) to yield a multilayer device wherein the contact layer has a substantially vertical side profile and the contact layer partially covers the upper magnetic member and wherein the upper magnetic member covers the insulating tunnel barrier layer; and (h) plasma etching select side portions of the second magnetic member that are distal from the multilayer device and the insulating tunnel baffler layer whereby the insulating tunnel barrier layer is a stop layer thereby causing an outer perimeter of the upper magnetic member to recede toward the multilayer device and thereby exposing an upper of the insulating tunnel baffler layer so that said exposed upper layer electrically separates the upper magnetic member that has an outer perimeter on the upper surface of the insulating tunnel barrier layer from the lower magnetic member that is underneath the insulating tunnel barrier layer.

52. A process of fabricating a magnetic tunnel junction device that comprises the steps of:

(a) forming a first magnetic member that is a fixed ferromagnetic layer having a magnetic moment that is fixed in a preferred direction in the presence of an applied magnetic field in a specified range;

(b) forming a second magnetic member that is free ferromagnetic layer whose magnetic moment is free to rotate in the presence of an applied magnetic field in the specified range;

(c) forming an insulating tunnel barrier layer that comprises a dielectric material located between the first magnetic member and the second magnetic member;

(d) forming a contact layer on an upper surface of the second magnetic member;

(e) forming a patterned mask over the contact layer;

(f) selectively removing portions of the contact layer;

(g) removing the patterned mask; and (h) selectively removing portions of the second magnetic member and the insulating tunnel barrier layer such that the second magnetic member is electrically isolated from the first magnetic member.

53. A process of fabricating a magnetic tunnel junction device that comprises the steps of:

(a) forming a first magnetic member that is a fixed ferromagnetic layer having a magnetic moment that is fixed in a preferred direction in the presence of an applied magnetic field in a specified range;

(b) forming a second magnetic member that is free ferromagnetic layer whose magnetic moment is free to rotate in the presence of an applied magnetic field in the specified range; (c) forming an insulating tunnel barrier layer that comprises a dielectric material located between the first magnetic member and the second magnetic member;

(c) forming an insulating tunnel barrier layer that comprises a dielectric material located between the first magnetic member and the second magnetic member;

(d) forming a contact layer on an upper surface of the second magnetic member;

(e) forming a patterned mask over the contact layer;

(f) selectively removing portions of the contact layer;

(g) removing the patterned mask; and (h) selectively removing portions of the second magnetic member and the insulating tunnel layer such that at least one side portion of the second magnetic member and of the insulating tunnel barrier layer define a non-vertical profile which protrudes outwardly from the at least one side portion.

54. A process of fabricating a magnetic tunnel junction device that comprises the steps of:

(a) forming a lower (or first) magnetic member that is a fixed ferromagnetic layer having a magnetic moment that is fixed in a preferred direction in the presence of an applied magnetic field in a specified range;

(b) forming an upper (or second) magnetic member that is free ferromagnetic layer whose magnetic moment is free to rotate in the presence of an applied magnetic field in the specified range; (c) forming an insulating tunnel barrier layer that comprises a dielectric material located between the first magnetic member and the second magnetic member;

(c) forming an insulating tunnel barrier layer that comprises a dielectric material located between the lower magnetic member and the upper magnetic member;

(d) forming a contact layer on an upper surface of the upper magnetic member;

(e) forming a patterned mask over the contact layer to create a multilayer structure;

(f) selectively removing portions of the contact layer that are exposed by the patterned mask;

(g) removing the patterned mask subsequent to step (f) to yield a multilayer device wherein the contact layer has a substantially vertical side profile and the contact layer partially covers the upper magnetic member and wherein the upper magnetic member covers the insulating tunnel barrier layer; and (h) selectively removing side portions of the upper magnetic member that are distal from the multilayer device thereby causing the outer perimeter of the upper magnetic member to recede toward the multilayer device and thereby exposing an upper of the insulating tunnel layer so that said exposed upper layer electrically separates the upper magnetic member that has an outer perimeter on the upper surface of the insulating from the lower magnetic member that is underneath the insulating tunnel layer.

55. The process of claim 52, 53 or 54 wherein the fixed ferromagnetic layer is formed from a material that is selected from the group consisting of NiFe, CoFe, CoFeB, NiFeCr, CoNiFe and mixtures thereof and the free ferromagnetic layer is formed from material that is selected from the group consisting of NiFe, CoFe, CoFeB, NiFeCr, CoNiFe and mixtures thereof.

56. The process of claim 52, 53 or 54 further comprising the step of providing a support substrate onto which a second contact layer is formed.

57. The process of claim 56 wherein the contact layer is a conductive non-magnetic layer that formed from material that is selected from the group consisting of Ta, Ti and mixtures thereof and the second contact layer is a layer that is formed from material that is selected from the group consisting of Ta, Ti and mixtures thereof.

58. The process of claim 52, 53 or 54 wherein the magnetic tunnel junction device is employed a magnetic random access memory device.

59. The process claim 58 wherein an outer perimeter of the magnetic tunnel junction device that includes at least part of the (i) second magnetic member and of the (ii) insulating tunnel barrier layer defines a non-vertical profile and the second magnetic member has a width that is less than that of the tunnel barrier layer.

60. The process of claim 59 wherein the first magnetic member has a width that is equal to or greater than that of the tunnel barrier layer.

61. The process of claim 52, 53 or 54 wherein step (f) comprises plasma etching portions of the contact layer.

62. A process of fabricating a magnetic tunnel junction device that comprises the steps of:
(a) forming a first magnetic member;
(b) forming a second magnetic member;
(c) forming an insulating tunnel barrier layer that comprises $Al_2O_3$ located between the first magnetic member and the second magnetic member;
(d) forming a contact layer on an upper surface of the second magnetic layer;
(e) forming a patterned mask over the contact layer;
(f) selectively removing portions of the contact layer;
(g) removing the patterned mask;
(h) plasma etching a majority portion of the second magnetic member in a reactor chamber of a plasma etch reactor wherein a plasma is generated with reactant gas in an electric field formed between a first electrode and a second electrode; and
(i) plasma etching a remaining portion of the second magnetic member such that the insulating tunnel barrier layer serves as a stop layer and wherein at least one side portion of the second magnetic member and of the insulating tunnel barrier layer define a non-vertical profile which protrudes outwardly from the at least one side portion.

63. The process of claim 62 wherein the second magnetic member is electrically isolated from the first magnetic member.

64. The process of claim 62 wherein the second magnetic member has a width that is less than that of the tunnel barrier layer.

65. The process of claim 64 wherein the first magnetic member has a width that is equal to or greater than that of the tunnel barrier layer.

66. The process of claim 62 further comprising the steps of monitoring the etching in step (f) and terminating the etching in step (f) when an endpoint has been reached when the majority of the second magnetic member has been removed.

67. The process of claim 66 wherein the endpoint is reached when the monitoring detects etching of the insulating tunnel barrier layer.

68. The process of claim 62 wherein in step (i) the second magnetic member is etched at a rate that is at least 7 times faster than the rate at which $Al_2O_3$ is etched.

69. The process of claim 62 wherein after step (h) and before step (i), the process further comprising the steps of:
(1) plasma treating the device in an environment containing He and $H_2$ to remove corrosive materials;
(2) optionally, rinsing the treated device; and
(3) baking the device to remove the He and $H_2$.

70. The process of claim 69 wherein step (h) comprises selectively etching a majority of the second magnetic member under first etching conditions; and step (i) comprises selectively etching a remaining portion of the second magnetic member under second etching conditions such that the insulating tunnel barrier layer serves as a stop layer.

71. The process of claim 70 wherein step (h) comprises reactive plasma etching using an etchant species comprising a mixture of $Cl_2$ and $BCl_3$.

72. The process of claim 71 wherein the mixture comprises from about 10% to 50% $Cl_2$ by volume and from about 10% to 30% $BCl_3$ by volume.

73. The process of claim 71 wherein the mixture consists essentially of from about 10% to 50% $Cl_2$ by volume and from about 10% to 30% $BCl_3$ by volume.

74. The process of claim 73 comprising adding oxygen and a carrier gas to the etchant species.

75. The process of claim 52, 53 or 54 wherein only a single patterned mask is employed.

76. The process of claim 75 wherein the patterned mask comprises a hard mask.

77. The process of claim 75 wherein the patterned mask comprises photoresist.

78. The process of claim 52, 53 or 54 wherein the first magnetic member is a fixed ferromagnetic layer having a magnetic moment that is fixed in a preferred direction in the presence of an applied magnetic field in the range of interest and the second magnetic member is a free ferromagnetic layer whose magnetic moment is free to rotate in the presence of an applied magnetic field in the range of interest.

79. The process of claim 78 wherein the fixed ferromagnetic layer is formed from a material that is selected from the group consisting of NiFe, CoFe, CoFeB, NiFeCr, CoNiFe and mixtures thereof and the free ferromagnetic layer is formed from material that is selected from the group consisting of NiFe, CoFe, CoFeB, NiFeCr, CoNiFe and mixtures thereof.

80. The process of claim 52, 53 or 54 further comprising the step of providing a support substrate onto which a second contact layer is formed.

81. The process of claim 80 wherein the contact layer is a conductive non-magnetic layer that is formed from material that is selected from the group consisting of Ta, Ti and mixtures thereof and the second contact layer is a conductive non-magnetic layer that is formed from material that is selected from the group consisting of Ta, Ti and mixtures thereof.

82. The process of claim 52, 53 or 54 wherein the magnetic tunnel junction device is employed in a magnetic random access memory device.

83. The process of claim 52, 53 or 54 wherein an outer perimeter of the magnetic tunnel junction device includes at least part of the (i) second magnetic member and of the (ii) insulating tunnel barrier layer defines a non-vertical profile and the second magnetic member has a width that is less than that of the tunnel baffler layer.

84. The process of claim 83 wherein the first magnetic member has a width that is equal to or greater than that of the tunnel barrier layer.

85. The process of claim 52, 53 or 54 wherein step (f) comprises plasma etching portions of the contact layer.

* * * * *

UNITED STATES PATENT AND TRADEMARK OFFICE
CERTIFICATE OF CORRECTION

PATENT NO. : 7,169,623 B2
APPLICATION NO. : 10/937660
DATED : January 30, 2007
INVENTOR(S) : Robert Ditizio It is certified that error appears in the above-identified patent and that said Letters Patent is hereby corrected as shown below:

Column 14, line 30:
Delete "to insulating tunnel" and insert -- the insulating tunnel --.

Column 14, line 37:
Delete "layer tat com-" and insert -- layer that com- --.

Column14, line 47:
Delete "to insulating tunnel" and insert -- the insulating tunnel --.

Column 15, lines 47-50, within section (b):
Delete "(c) forming an insulating tunnel barrier layer that comprises a dielectric material located between the first magnetic member and the second magnetic member;"

Column16, lines 8-11, within section (b):
Delete "(c) forming an insulating tunnel barrier layer that comprises a dielectric material located between the first magnetic member and the second magnetic member;"

Signed and Sealed this

Third Day of April, 2007

JON W. DUDAS
*Director of the United States Patent and Trademark Office*